(12) United States Patent
Nelson

(10) Patent No.: US 6,787,438 B1
(45) Date of Patent: Sep. 7, 2004

(54) DEVICE HAVING ONE OR MORE CONTACT STRUCTURES INTERPOSED BETWEEN A PAIR OF ELECTRODES

(75) Inventor: Richard D. Nelson, Austin, TX (US)

(73) Assignee: Teravieta Technologies, Inc., Austin, TX (US)

( * ) Notice: Subject to any disclaimer, the term of this patent is extended or adjusted under 35 U.S.C. 154(b) by 123 days.

(21) Appl. No.: 09/981,610

(22) Filed: Oct. 16, 2001

(51) Int. Cl.[7] .......................... H01L 21/20; H01L 29/00
(52) U.S. Cl. .................. 438/584; 585/52; 585/459; 585/29; 585/50; 585/73; 585/464; 585/51; 257/528; 257/254; 257/532; 257/508; 257/415; 257/416; 257/417
(58) Field of Search ................................ 438/584, 585, 438/52, 459, 29, 50, 73, 464, 20, 51; 257/528, 254, 532, 508, 415–421

(56) References Cited

U.S. PATENT DOCUMENTS

| | | |
|---|---|---|
| 4,543,457 A | 9/1985 | Petersen et al. |
| 4,959,515 A | 9/1990 | Zavracky et al. |
| 5,377,524 A | 1/1995 | Wise et al. |
| 5,526,172 A * | 6/1996 | Kanack ....................... 359/291 |
| 5,578,976 A | 11/1996 | Yao |
| 5,619,061 A * | 4/1997 | Goldsmith et al. ......... 257/528 |
| 5,629,565 A | 5/1997 | Schlaak et al. |
| 5,638,946 A | 6/1997 | Zavracky |
| 5,673,785 A | 10/1997 | Schlaak et al. |
| 5,867,302 A | 2/1999 | Fleming |
| 5,994,796 A | 11/1999 | De Los Santos |
| 6,016,092 A | 1/2000 | Qiu et al. |
| 6,057,520 A | 5/2000 | Goodwin-Johansson |
| 6,069,540 A | 5/2000 | Berenz et al. |
| 6,072,686 A | 6/2000 | Yarbrough |
| 6,100,477 A | 8/2000 | Randall et al. |
| 6,100,862 A | 8/2000 | Sullivan |
| 6,143,997 A | 11/2000 | Feng et al. |
| 6,153,839 A | 11/2000 | Zavracky et al. |
| 6,168,395 B1 | 1/2001 | Quenzer et al. |
| 6,183,097 B1 | 2/2001 | Saif et al. |
| 6,188,301 B1 | 2/2001 | Kornrumpf et al. |
| 6,201,629 B1 | 3/2001 | McClelland et al. |
| 6,204,737 B1 | 3/2001 | Ella |
| 6,212,314 B1 | 4/2001 | Ford |
| 6,486,425 B2 * | 11/2002 | Seki ........................... 200/181 |
| 6,529,093 B2 * | 3/2003 | Ma ............................. 333/101 |

OTHER PUBLICATIONS

Hyman et al., "Contact Physics of Gold Microcontacts for MEMS Switches," © 1998 IEEE, pp. 133–140.

Majumder et al., "Measurement and Modeling of Surface Micromachined, Electrostatically Actuated Microswitches," © 1997 IEEE, pp. 1145–1148.

(List continued on next page.)

Primary Examiner—Caridad Everhart
Assistant Examiner—Igwe U. Anya
(74) Attorney, Agent, or Firm—Kevin L. Daffer; Mollie E. Lettang; Conley Rose P.C.

(57) ABSTRACT

A microelectromechanical device is provided which includes a contact structure interposed between a pair of electrodes arranged beneath a beam. In some embodiments, the device may include additional contact structures interposed between the pair of electrodes. For example, the device may include at least three contact structures between the pair of electrodes. In some embodiments, the beam may be suspended above the pair of electrodes by a support structure affixed to a first end of the beam. Such a device may further include an additional support structure affixed to a second end of the beam. In some cases, the device may be adapted to pass a signal from the first end to the second end of the beam. In addition or alternatively, the device may be adapted to pass the signal between one or both ends of the beam and one or more of the contact structures.

36 Claims, 8 Drawing Sheets

OTHER PUBLICATIONS

Majumder et al., "Study of Contacts in an Electrostatically Actuated Microswitch," © 1998, IEEE, pp. 127–132.

Zavracky et al., "Microswitches and Microrelays with a New Toward Microwave Applications," © 1999 John Wiley & Sons, Inc., pp. 338–347.

Zavracky et al., "Micromechanical Switches Fabricated using Nickel Surface Micromachining," 201 1997 IEEE, pp. 3–9.

Chalmers, "Relay Races," Jan. 2001, Mechanical Engineering, pp. 66–68.

Hirata et al., "A Micromechanical Switch as the Logic Elements for Circuits in Multi Chip Module on Si (MCM–Si)," 6 pages.

Petersen, "Silicon as a Mechanical Material," © 1982 IEEE, pp. 420–457.

Milanovic et al., "Microrelays for Batch Transfer Integration in RF Systems," © 2000 IEEE, pp. 787–792.

McGruer et al., "Electrostatically Actuated MicroSwitches; Scaling Properties," 1998, pp. 132–135.

* cited by examiner

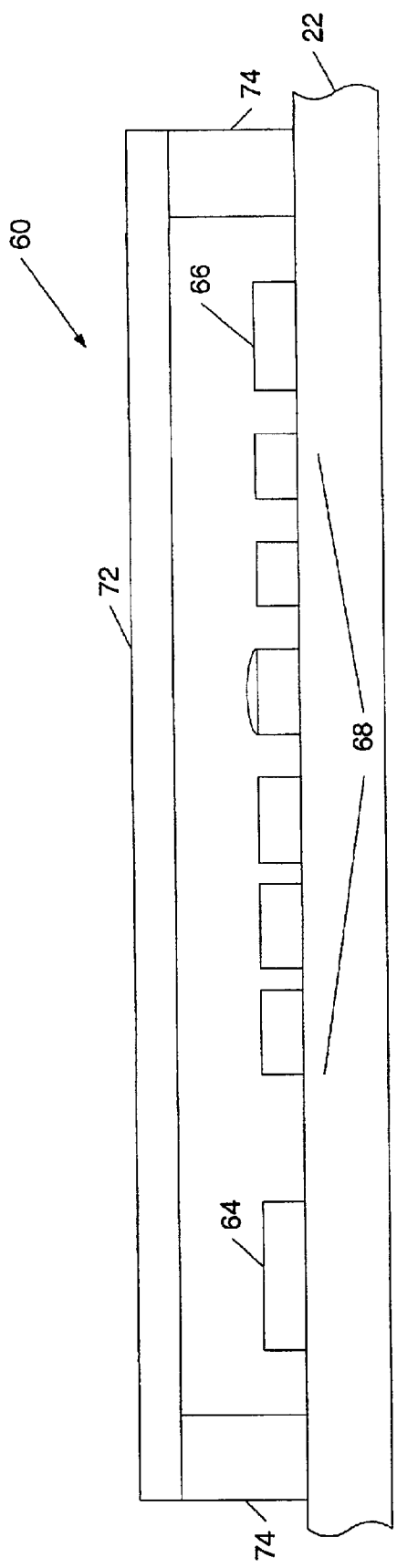
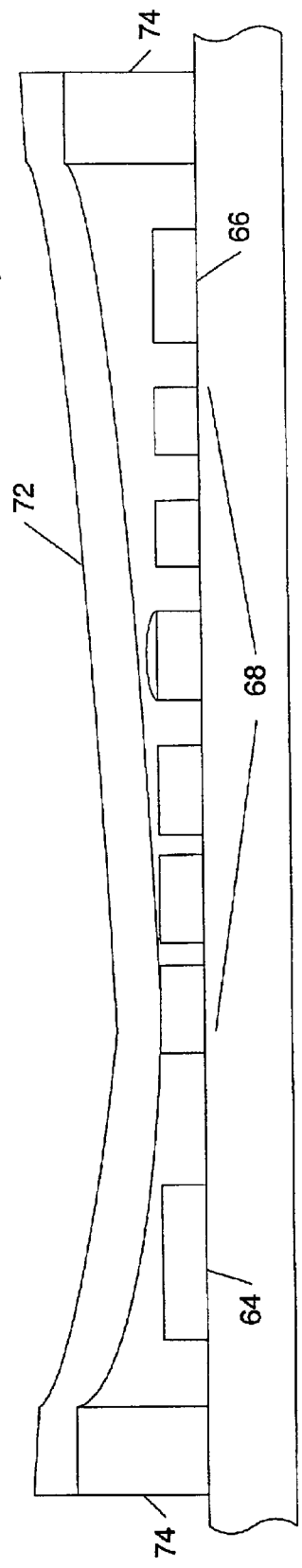
Fig. 10
Fig. 11

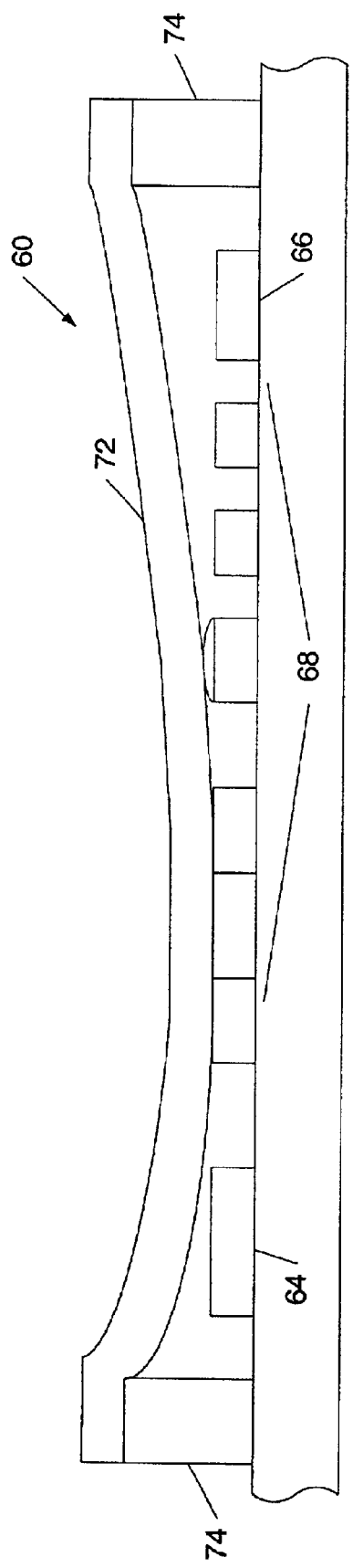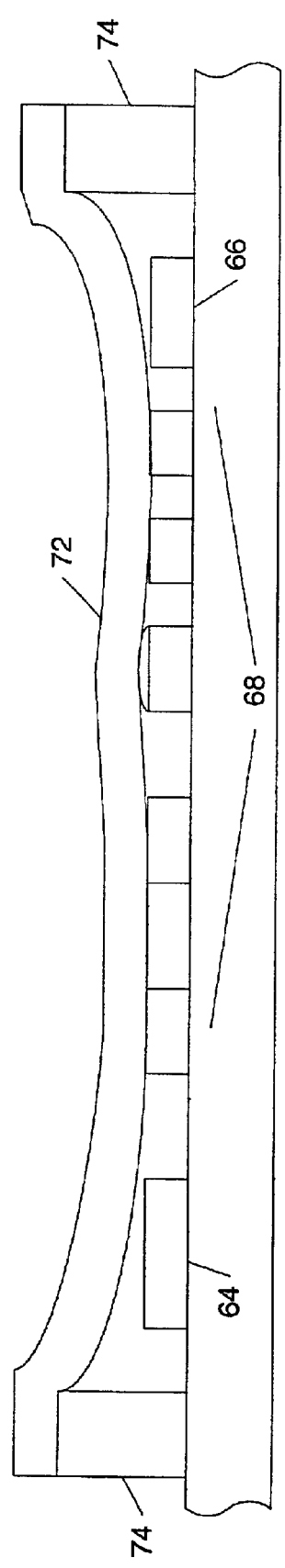

DEVICE HAVING ONE OR MORE CONTACT STRUCTURES INTERPOSED BETWEEN A PAIR OF ELECTRODES

BACKGROUND OF THE INVENTION

1. Field of the Invention

This invention relates to microelectromechanical devices, and more particularly, to a microelectromechanical device in which includes one or more contact structures interposed between a pair of electrodes.

2. Description of the Related Art

The following descriptions and examples are not admitted to be prior art by virtue of their inclusion within this section.

Microelectromechanical devices, or devices made using microelectromechanical systems (MEMS) technology, are of interest in part because of their potential for allowing integration of high-quality devices with circuits formed using integrated circuit (IC) technology. For example, MEMS switches may exhibit lower losses and a higher ratio of off-impedance to on-impedance as compared to transistor switches formed from conventional IC technology. However, a persistent problem with implementation of MEMS switches has been the high voltage required (often about 40V or higher) to actuate the switches, as compared to typical IC operating voltages (about 5V or lower).

These relatively high actuation voltages of MEMS switches are caused at least in part by a tradeoff between the closing and opening effectiveness of a given switch design. For example, approaches to lowering the actuation voltage of switches have included reducing the stiffness of the switch beam and/or reducing the gap between the beam and the conductive pad. Unfortunately, these design changes typically result in making the switch more difficult to open. MEMS switch designs generally use an applied voltage to close the switch, and rely on the spring force in the beam to open the switch when the applied voltage is removed. In opening the switch, the spring force, or restoring force, of the beam must typically counteract what is often called "stiction." Stiction refers to various forces tending to make two surfaces stick together such as van der Waals forces, surface tension caused by moisture between the surfaces, and/or bonding between the surfaces (e.g., through metallic diffusion). In general, modifications to a switch which act to lower the closing voltage also tend to make the switch harder to open, such that efforts to form a switch with a lowered closing voltage can result in a switch which may not open reliably (or at all).

Another limitation typically found in MEMS devices is the presence of residual stresses contained within the switch beam. In particular, the residual stresses within a beam may cause the beam to curl either away from contact structures or toward contact structures without the activation of actuation voltages. In the event that the beam curls down and closes a contact prematurely, the switch may become inoperable because significant electrostatic repulsion between the gate and the beam cannot be established. In this manner, the switch may not be opened by removing an applied voltage as described above. In other cases, MEMS devices may be designed such that the functionality of the devices is dependent on the presence of residual stresses within the beam. For example, a device may be designed to have compressive stresses within the beam in order to curl one portion of the beam in one direction as another portion of the beam curls in the opposite direction. Actuation voltages may then be used to oscillate the beam between its original state and the mirror image of the original state. Such a device, however, may be difficult to consistently fabricate since residual stresses within the beam may be dependent on the properties of the beam materials and such properties may change as variables of the fabrication process change. In addition, the range of materials used within such a MEMS device may be limited.

It would therefore be desirable to develop a MEMS device which relaxes the constraints imposed by the above-described tradeoff between opening and closing effectiveness and the presence of residual stresses within the device.

SUMMARY OF THE INVENTION

The problems outlined above may be in large part addressed by a microelectromechanical device which includes a contact structure interposed between a pair of electrodes arranged beneath a beam. In some embodiments, the device may include additional contact structures interposed between the pair of electrodes. For example, the device may include at least three contact structures between the pair of electrodes. Preferably, the additional contact structures may be spaced along and under a length of the beam adjacent to the contact structure. In some embodiments, the beam may be suspended above the pair of electrodes by a support structure affixed to a first end of the beam. Such a device may further include an additional support structure affixed to a second end of the beam. In some cases, the device may be adapted to pass a signal from the first end to the second end of the beam. In addition or alternatively, the device may be adapted to pass the signal between one and/or both ends of the beam and one or more of the contact structures.

As stated above, a microelectromechanical device is provided which includes a contact structure interposed between a pair of electrodes arranged beneath a beam. In some embodiments, the beam may be suspended by support structures affixed to first and second ends of the beam. Alternatively, the beam may be solely supported at one end of the beam. In either embodiment, the device may be adapted to pass a signal between one and/or both ends of the beam and the contact structure. In addition or alternatively, the device may be adapted to pass a signal from the first end to the second end of the beam. In particular, the device may be adapted to pass the signal through the beam upon bringing the beam in contact with the contact structure. In an alternative embodiment, the device may be adapted to pass the signal through the beam without bringing the beam in contact with the contact structure interposed between the pair of electrodes. In such an embodiment, the beam may include a contiguous layer of conductive material. Alternatively, the beam may include an insulating element interposed between the first and second ends of the beam.

In some embodiments, the device may include one or more additional contact structures interposed between the pair of electrodes. In such an embodiment, the upper surface of the contact structure may be above or below the upper surfaces of the additional contact structures. In some cases, the contact structure may include a raised section arranged upon its upper surface. Alternatively, the upper surface of the contact structure may be approximately level with upper surfaces of the additional contact structures. In such an embodiment, the beam may include a recessed portion above the contact structure. In some cases, one or more of the additional contact structures and contact structure may include multiple sections spaced apart from each other and arranged along the width of the beam.

In some cases, the device may be adapted to bring the beam in contact with one or more of the contact structures. For example, the beam may include residual forces adapted to bring the beam in contact with one or more of the contact structures. Such residual forces may be further adapted to curl the beam away from one or more of the contact structures distinct from the contact structures in contact with the beam. In an alternative embodiment, the device may be adapted to bring the beam in contact with one or more of the contact structures upon an application of one or more closing voltages to at least one of the pair of electrodes. More specifically, the beam may be brought in contact with one or more of the contact structures upon applying a closing voltage to one of the pair of electrodes. In an alternative embodiment, the beam may be brought in contact with one or more of the contact structures upon applying a closing voltage to both of the pair of electrodes. In yet another embodiment, the device may be adapted to bring the beam in contact with one or more of the contact structures by other forms of actuation on the controlling elements (e.g., gate electrodes) of the device. For example, the device may be adapted to bring the beam in contact with one or more of the contact structures upon magnetic, piezoelectric, or thermal actuation.

In either embodiment, the device may be adapted to pull the beam away from the one or more contact structures in contact with the beam. For example, an application of an actuation voltage to one of the pair of electrodes may pull the beam away from the one or more contact structures in contact with the beam. In some embodiments, such an actuation voltage may be adapted to bring the beam in contact with one or more contact structures, which are not previously in contact with the beam. Alternatively, the application of such an actuation voltage may not bring the beam in contact with any additional contact structures. In an embodiment in which a closing voltage is applied to one of the pair of electrodes to bring the beam in contact with one or more contact structures, the device may be adapted to pull the beam away from one or more of the contact structures upon a release of the closing voltage during or after an application of an actuation voltage to the other of the pair of electrodes. Alternatively, such a device may be adapted to pull the beam away from one or more of the contact structures upon an increase of an actuation voltage applied to the other of the pair of electrodes during or after a release of the closing voltage.

In an embodiment, the device may include at least three contact structures interposed between the pair of electrodes. In such an embodiment, the contact structures and pair of electrodes may be laterally spaced along and under a length of a beam. As stated above, the device may include a support structure attached to a first end of the beam. In some cases, the device may include an additional support structure attached to a second end of the beam. In either embodiment, the device may include a first contact structure interposed between the pair of electrodes and a second contact structure interposed between the first contact structure and one of the pair of electrodes. Such a device may further include a third contact structure interposed between the first contact structure and the other of the pair of electrodes. In some cases, the first contact structure may be arranged under the center point of the beam. Alternatively, the first contact structure may be arranged closer to the one of said pair of electrodes than to the other of said pair of electrodes. In some embodiments, the device may further include one or more contact structures interposed between said first and second contact structures. In addition or alternatively, the device may include one or more contact structures interposed between said second contact structure and the one of the pair of electrodes.

A method for fabricating the microelectromechanical device as described above is also contemplated herein. In particular, the method may include patterning an array of contact structures between a pair of electrodes. In some embodiments, patterning the contact structures may include patterning base structures of the contact structures and then patterning a raised section upon the upper portion at least one of the base structures. In addition or alternatively, the method may include forming support structures laterally adjacent the sides of the pair of electrodes facing away from the array of contact structures. The method may further include forming a beam spaced above the electrodes and contact structures such that the beam is supported at its respective lateral ends. In some cases, forming the beam may include forming a sacrificial layer upon the electrodes, the contact structures, and exposed portions of the substrate. A beam layer may be deposited upon said sacrificial layer and the sacrificial layer may be subsequently removed. Forming the sacrificial layer may include, for example, depositing the sacrificial layer upon the pair of electrodes, the contact structures, and exposed portions of the substrate and etching recesses within the sacrificial layer. In some cases, etching the sacrificial layer may include etching recesses above at least one of the contact structures. In addition or alternatively, etching the sacrificial layer may include etching recesses laterally adjacent to sides of the pair of electrodes facing away from the array of contact structures.

There may be several advantages to forming a device that includes a contact structure interposed between a pair of electrodes arranged beneath a beam. For example, either of the pair of electrodes may be used to bring the beam in contact with the contact structure, allowing greater design flexibility in the device. Alternatively, both of the pair of electrodes may be used to bring the beam in contact with the contact structure. In such an embodiment, the device may operate at lower actuating voltages, thereby making implementation with integrated circuits more feasible. Moreover, further advantages may be realized in embodiments in which additional contact structures are interposed between the pair of electrodes. For example, a device with a plurality of contact structures interposed between a pair of electrodes may overcome the opening difficulties associated with surface tension issues, such as stiction. As such, a more flexible beam may be employed within the device. Consequently, the device may operate at lower actuating voltages. In addition, the functionality of the device as described herein is not restricted by residual stresses contained within the device since a repulsive electrostatic force between the gate and beam is not required to exist in order to deflect the cantilever from the conductive pad. In other words, the device as described herein may deflect a beam that has come in contact with a contact structure without the influence of a repulsive electrostatic force.

BRIEF DESCRIPTION OF THE DRAWINGS

Other objects and advantages of the invention will become apparent upon reading the following detailed description and upon reference to the accompanying drawings in which:

FIG. 10 depicts a partial cross-sectional view of a microelectromechanical device, in an alternative embodiment, which includes multiple contact structures interposed between a pair of electrodes arranged under a beam;

FIG. 11 depicts a partial cross-sectional view of the microelectromechanical device of FIG. 10 with the beam in contact with one of the contact structures; FIG. 12 depicts a partial cross-sectional view of the microelectromechanical device of FIG. 10 with the beam in contact with a plurality of the contact structures;

FIG. 13 depicts a partial cross-sectional view of the microelectromechanical device of FIG. 10 with the beam in contact with all of the contact structures;

Figure 1:
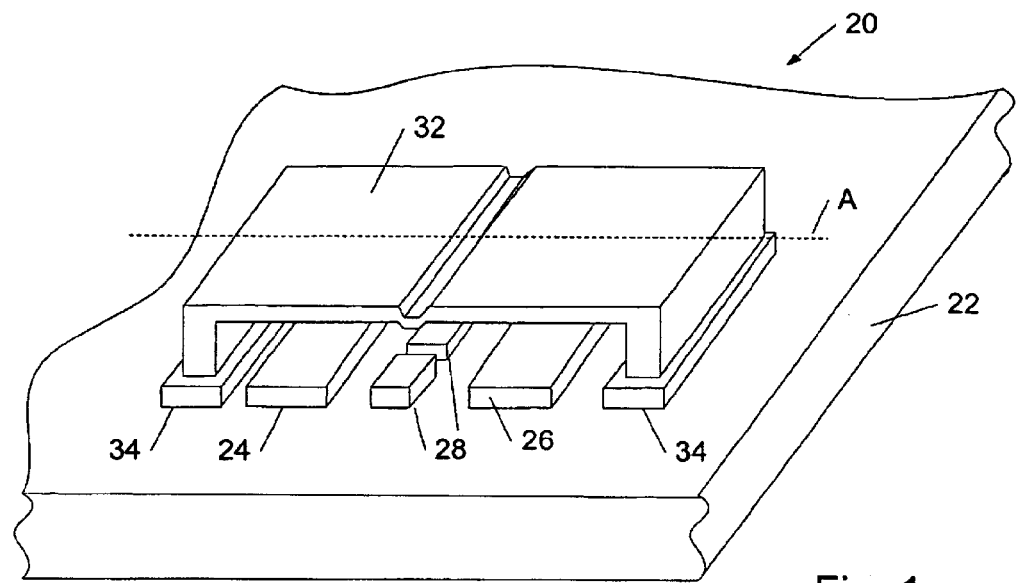
FIG. 1 depicts a perspective view of a microelectromechanical device that includes a contact structure interposed between two electrodes underneath a beam.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
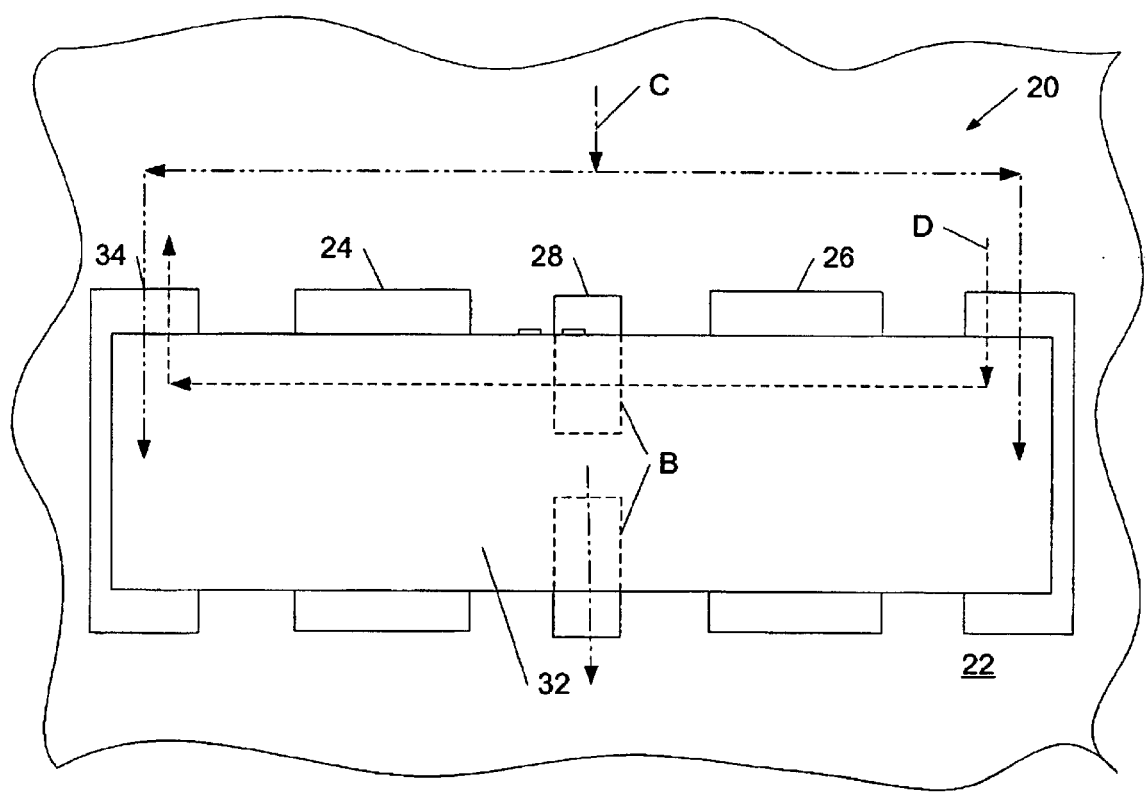
FIG. 2 depicts a top view of the microelectromechanical device of FIG. 1.
Figure 3:
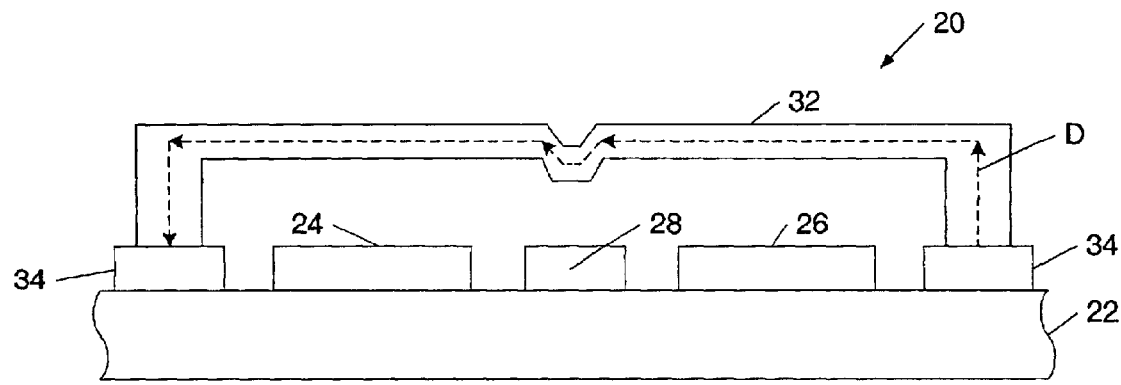
FIG. 3 depicts a partial cross-sectional view of the microelectromechanical device of FIG. 1.

Turning to the drawings, FIGS. 1–14 illustrate exemplary embodiments of microelectromechanical devices, which include a contact structure interposed between a pair of electrodes. For example, FIGS. 1–3 illustrate an exemplary embodiment of MEMS device 20 which includes contact structure 28 interposed between gate electrodes 24 and 26. In particular, FIG. 1 depicts a perspective view of MEMS device 20, while FIGS. 2 and 3 illustrate a top view and cross-sectional view of MEMS device 20, respectively. The cross-sectional view in FIG. 3 is taken along line A of FIG. 1. Lines B in FIG. 2 outline the edges of multiple sections of contact structures 28 as described below. In addition, lines C and D shown in FIGS. 2–4b illustrate exemplary embodiments of signal paths that may be routed through MEMS device 20. Such signal paths are described in more detail below. It is noted that FIGS. 1–3 are not drawn to same scale. In particular, the vertical scale of FIGS. 1–3, as well as of FIGS. 4a–14, is greatly exaggerated to emphasize the components of the devices. In general, the lateral dimensions of such devices may be on the order of tens to hundreds of microns while the vertical dimensions may be on the order of one to several microns.

In the embodiment of FIGS. 1–3, MEMS device 20 is arranged upon substrate 22 with beam 32 spaced above gate electrodes 24 and 26 and contact structure 28. As stated above, contact structure 28 is preferably interposed between gate electrodes 24 and 26. In some embodiments (not shown), MEMS device 20 may include additional contact structures interposed between gate electrodes 24 and 26, on either or both sides of contact structure 28. In another embodiment, MEMS device 20 may include insulating structures (not shown) arranged between gate electrodes 24 and 26 and contact structure 28. In an embodiment in which substrate 22 is incorporated into an integrated circuit, substrate 22 may be, for example, a silicon, ceramic, or gallium arsenide substrate. Alternatively, substrate 22 may be glass, polyimide, metal, or any other substrate material commonly used in the fabrication of microelectromechanical devices. For example, substrate 22 may be a monocrystalline silicon substrate or an epitaxial silicon layer grown on a monocrystalline silicon substrate. In addition, substrate 22 may include a silicon on insulator (SOI) layer, which may be formed upon a silicon wafer.

Gate electrodes 24 and 26 may include a conductive material, such as polysilicon or metal. In particular, gate electrodes 24 and 26 may include gold, copper, titanium, tungsten, or alloys of such metals. In one embodiment, gate electrodes 24 and 26 may include the same materials. In another embodiment, gate electrodes 24 and 26 may include different materials. Gate electrodes 24 and 26 are preferably arranged under beam 32 such that the lengths of gate electrodes 24 and 26 are perpendicular to the length of beam 32. In this manner, gate electrodes 24 and 26 may extend beyond the periphery of beam 32 as shown in FIG. 2. Alternatively, the lengths of gate electrodes 24 and 26 may be substantially similar to the width of beam 32. In addition, as shown in FIGS. 1–3, the widths of gate electrodes 24 and 26 may be substantially the same as each other. Alternatively, gate electrodes 24 and 26 may have substantially different widths. In particular, gate electrode 26 may be wider or narrower than gate electrode 24.

In some cases, gate electrodes 24 and 26 may be arranged symmetrically under beam 32. For example, gate electrodes 24 and 26 may be arranged under beam 32 such that there is an equal distance between each gate electrode and its respective end of the beam. In addition or alternatively, the symmetrical arrangement may include an equal distance between each of the gate electrodes and contact structure 28 as shown in FIGS. 1–3. Conversely, the arrangement of gate electrodes 24 and 26, in some embodiments, may be asymmetrical under beam 32. In this manner, gate electrodes 24 and 26 may be spaced at an unequal distance from the respective ends of beam 32 and/or contact structure 28.

Contact structure 28 may be arranged upon substrate 22 and interposed between gate electrodes 24 and 26. Contact structure 28 may include a conductive material such as gold, copper, titanium, tungsten, or an alloy of such metals. As such, contact structure 28 may include the same material as gate electrodes 24 and/or 26. Such an embodiment may be particularly advantageous because contact structure 28 and gate electrodes 24 and/or 26 may be formed simultaneously during the fabrication of MEMS device 20. Alternatively, contact structure 28 may include a different material than gate electrodes 24 and 26. In embodiments in which contact structure 28 includes a conductive material, contact structure 28 may serve as a conductive pad. In this manner, contact structure 28 may allow a signal to pass to and/or from beam 32 when MEMS device 20 is activated to bring beam 32 in contact with contact structure 28. In some embodiments, contact structure 28 may include a non-conductive material such as silicon dioxide ($SiO_2$), silicon nitride ($Si_xN_y$), silicon oxynitride ($SiO_xN_y(H_z)$), or silicon dioxide/silicon nitride/silicon dioxide (ONO). For example, contact structure 28 may include a dielectric cap layer arranged upon the conductive material. Such a dielectric cap layer may allow for capacitive coupling at contact structure 28.

As with gate electrodes 24 and 26, contact structure 28 may be arranged under beam 32 and may extend perpendicular to the width of beam 32. As such, contact structure 28 may extend beyond the periphery of beam 32. Alternatively, contact structure 28 may reside entirely under the periphery of beam 32. In some cases, contact structure 28 may include a single structure. In other embodiments, contact structure 28 may include multiple sections spaced laterlly adjacent to each other along the width of beam 32 as shown in FIGS. 1 and 2. In such an embodiment, the plurality of sections may include different materials. Alternatively, the multiple sections may include the same material. Furthermore, the upper surface of contact structure 28 may be above or below the upper surfaces of gate electrodes 24 and 26. Alternatively, contact structure 28 may be approximately the same height as gate electrodes 24 and 26.

As stated above, beam 32 is preferably spaced above gate electrodes 24 and 26 and contact structure 28. As such, beam 32 may be supported by one or more support structures arranged at either or both of the respective ends of the beam. In particular, beam 32 may be supported by support structures 34 as shown in FIGS. 1–3. Alternatively, beam 32 may only be supported by a single support structure such that beam 32 may be a cantilever beam. In either embodiment, support structures 34 may include similar materials to those used for contact structure 28 and/or gate electrodes 24 and 26. As such, support structures may include conductive or non-conductive materials. In an embodiment in which support structures 34 are conductive, support structures 34 may serve as conductive pads. In some cases, support structures 34 may include the same material as included in contact structure 28 and/or gate electrodes 24 and 26. Alternatively, support structures 34 may include a different material than included in contact structure 28 and/or gate electrodes 24 and 26. In addition, support structures 34 may be substantially the same height as contact structure 28 and/or gate electrodes 24 and 26 as shown in FIGS. 1–3. Alternatively, support structures 34 may be substantially higher or lower than contact structure 28 and/or gate electrodes 24 and 26. In yet another embodiment, support structures 34 may be omitted from the structure of MEMS device 20. In such an embodiment, beam 32 may extend down to substrate 22 at respective ends of the beam such that beam 32 may support itself.

Beam 32 may include a variety of materials. For example, beam 32 may include a dielectric material and/or a conductive material such as gold, copper, titanium, tungsten, or an alloy of such metals. In some cases, beam 32 may include the same material as included in contact structure 28 and/or gate electrodes 24 and 26. Alternatively, beam 32 may include a different material than included in contact structure 28 and/or gate electrodes 24 and 26. Preferably, beam 32 includes a material that may adequately bend in response to the introduction of an actuation force, such as an electrostatic or magnetic force between one or more of the gate electrodes and the beam. Alternatively, beam 32 may bend due to residual stresses contained within the beam. In other embodiments, beam 32 may bend due to piezoelectric or thermal deformations of the beam itself. In an embodiment in which an electrostatic force is applied, a relatively flexible material advantageously allows the device to be actuated at a relatively low voltage.

In addition or alternatively, beam 32 may include one or more recessed portions. For example, beam 32 may include a recessed portion, sometimes called a "dimple," above contact structure 28 as shown in FIGS. 1–3. In some embodiments, beam 32 may include multiple recessed portions over contact structure 28. In contrast, beam 32 may not include any recessed portions. In addition or alternatively, contact structure 28 may have a raised section arranged on its upper surface (not shown). The raised section may include flat, pointed, rounded, or square bumps. An example of a device with a raised section upon a contact structure is shown and described in FIGS. 10–14 below. Such raised sections and/or recessed portions of the cantilever may help localize contact between beam 32 and contact structure 28 while preventing contact between the gate electrodes and the beam. In addition, the raised and recessed features may help break through contamination that may reside upon the contact interface between contact structure 28 and the overlying portion of beam 32.

Figure 4A:
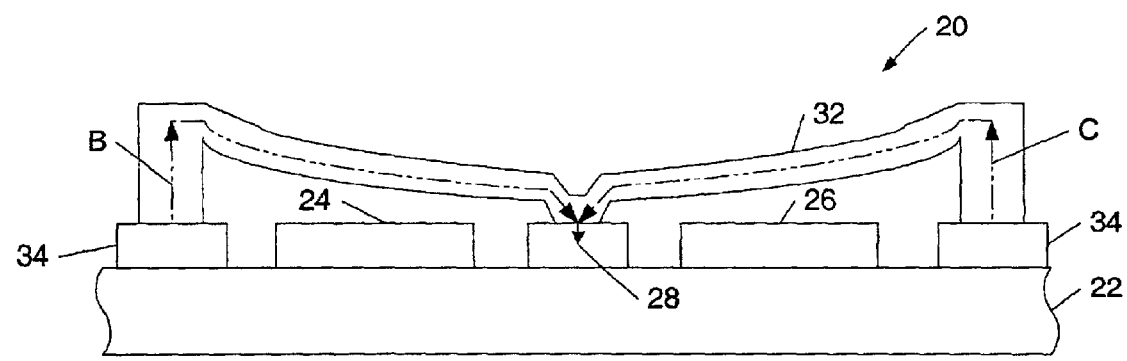
FIG. 4a depicts a partial cross-sectional view of the microelectromechanical device of FIG. 1 with the beam brought into contact with the contact structure by an application of a voltage to both of the pair of electrodes.
Figure 4B:
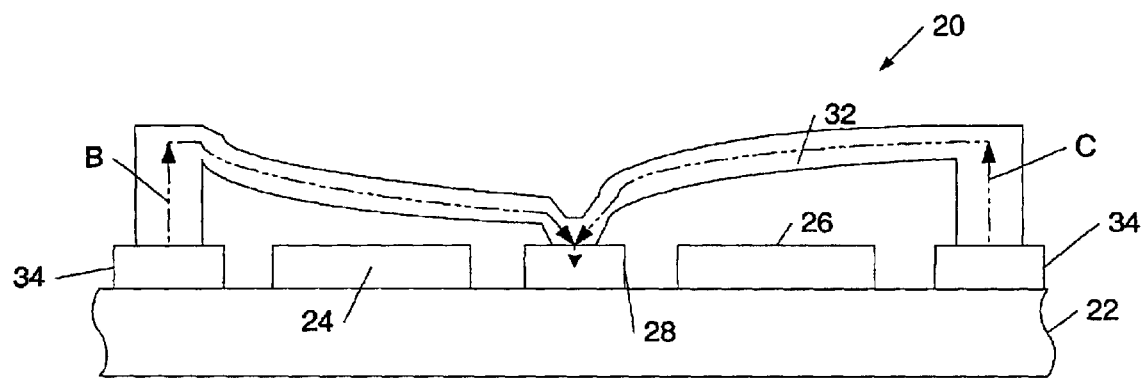
FIG. 4b depicts a partial cross-sectional view of the microelectromechanical device of FIG. 1 with the beam brought into contact with the contact structure by an application of a voltage to one of the pair of electrodes.
Figure 5:
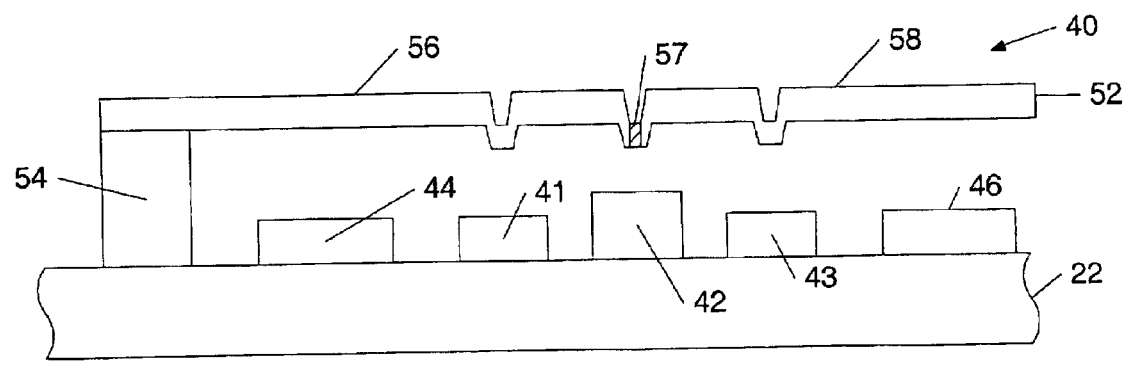
FIG. 5 depicts a partial cross-sectional view of a microelectromechanical device, in an alternative embodiment, which includes three contact structures interposed between a pair of electrodes arranged under a beam.

In general, MEMS device 20 may be adapted to pass a signal. Such a signal may be, for example, an electrical, acoustical, thermal, or optical signal. Regardless of the type of signal, the device may be adapted to pass the signal between one and/or both ends of beam 32 and contact structure 28. An example of such a signal path is illustrated in FIGS. 2, 4a, and 4b by line C. In particular, line C may be routed to both ends of beam 32 through support structures 34. Alternatively, line C may be routed to both ends of beam 32 without going through support structures 34. In another embodiment, line C may only be routed to one end of beam 32. In either case, the signal path may follow the contour of beam 32. As such, in an embodiment in which beam 32 is brought into contact with contact structure 28 such as illustrated and described in FIGS. 4a and 4b below, the signal path may continue to one or more segments of contact structure 28. In this manner, MEMS device 20 may be adapted to pass the signal from beam 32 to contact structure 28. Moreover, beam 32, in such an embodiment, may bridge a connection between two drain regions of a circuit such that a signal may pass through them. In addition or alternatively, MEMS device 20 may be adapted to pass the signal from contact structure 28 to one or more ends of beam 32. Such a signal path may be in the opposite direction of line C.

In addition or alternatively, MEMS device 20 may be adapted to pass the signal from a first end to a second end of the beam. More specifically, MEMS device 20 may be adapted to pass a signal along the entire length of the beam from one end to another. In one embodiment, MEMS device 20 may be adapted to pass a signal along the entire length of the beam without bringing beam 32 in contact with contact structure 28. An example of a signal path, in such embodiment, is illustrated in FIGS. 2 and 3. In particular, line D may represent a signal path routed through one end of beam 32 to the other end of beam 32. Such a signal path is shown to pass through support structures 34. However, the signal path may not be routed through the support structures in other embodiments.

In an embodiment in which a signal may pass from one end of the beam to another, beam 32 may include a contiguous layer of conductive material extending from a first end to a second end of the beam. In particular, beam 32 may include a contiguous layer of conductive material extending along the entire length of the beam. Such a beam may, in some embodiments, include layers of dielectric material above or below such a layer of conductive material. Alternatively, beam 32 may consist entirely of conductive material (i.e., a single layer of conductive material or multiple layers of conductive material). In an alternative embodiment, MEMS device 20 may be adapted to pass a signal from a first end of beam 32 to a second end of beam 32 upon bringing the beam in contact with contact structure 28. In such an embodiment, contact structure 28 preferably includes a conductive material without a dielectric capping layer thereon.

In some cases, beam 32 may include an insulating element interposed between conductive portions of the beam (not shown). In particular, such an insulating element may be arranged over contact structure 28 and in some embodiments, centered over contact structure 28. In general, the insulating element may be arranged along any lateral portion of beam 32, including above and between the gate electrodes and contact structures. In addition, the width of the insulating element may be smaller than the width of contact structure 28. As such, the conductive portions of beam 32 on either side of the insulating element may be in contact with contact structure 28 when beam 32 is brought in contact with the contact structure. Consequently, MEMS device 20 may be adapted to pass a signal between one end of beam 32 and contact structure 28. In this manner, the device may be adapted to close a circuit or short beam 32 to ground at contact structure 28. In addition, MEMS device 20 may be adapted to pass a signal from a first end of beam 32 to a second end of beam 32 through contact structure 28. Moreover, beam 32, in such an embodiment, may bridge a connection between two drain regions of a circuit such that a signal may pass through them. In some cases, the insulating element may be axially arranged within beam 32. More specifically, the insulating element may be interposed between conductive portions of beam 32 which extend from one end of beam 32 to the other end of the beam. An example of a device with an insulating element arranged with a beam is illustrated and described in FIGS. 5–9 below.

Depending on the particular device being formed, the arrangement of the contact structure and the control elements (e.g., the gate electrodes) may vary from that of FIGS. 1–4a and the other embodiments illustrated in FIGS. 5–14. The control elements shown in the figures are preferably gate electrodes for electrostatically actuated movement as described below, but other forms of actuation are possible and contemplated. For example, an actuating member could be made from a magnetic material, and a coil used as a control element in the case of a magnetically-actuated device. The applied magnetic force generated may vary across the surface of such a flat coil, thereby providing a form of force variation. Other force variation structures described herein, such as adaptations of the shape of the actuating member or the contact structure, may also be suitable for use with magnetic actuation. Other types of actuation, such as piezoelectric or thermal actuation in which moving elements include materials of dissimilar polarity properties and thermal expansion coefficients, respectively, may also be compatible with at least some of the force variation structures described herein.

Exemplary embodiments of MEMS device 20 in different actuation states are illustrated in FIGS. 3, 4a, and 4b. In particular, FIG. 3 illustrates MEMS device 20 in a non-actuated state in which beam 32 is not in contact with contact structure 28. In such an embodiment, beam 32 preferably includes a material stiff enough to prevent contact with contact structure 28 when an actuation force is not applied to gate electrodes 24 or 26. In an embodiment, contact between beam 32 and contact structure 28, as shown in FIG. 4a, may be caused by electrostatically actuating both gate electrodes 24 and 26 as illustrated by the curvature of beam 32 over both gate electrodes 24 and 26. In other words, a voltage may be applied to gate electrodes 24 and 26, thereby introducing an electrostatic force to pull down beam 32. The applied voltage may be approximately 5 V or higher. However, the applied voltage may vary significantly depending on the dimensions and the materials used in the device. Preferably, the voltage level is small enough such that beam 32 does not contact either of gate electrodes 24 and 26. Such a voltage level may be dependent on the flexibility of beam 32 and the size and arrangement of contact structure 28 and gate electrodes 24 and 26. In this manner, the material used for beam 32, the arrangement of the device components, and the voltage required to actuate MEMS device 20 may be optimized to produce a device that may be actuated by a low voltage and yet not undesirably cause contact with gate electrodes 24 and 26.

In some embodiments, gate electrodes 24 and 26 may be independently actuated by different voltage sources to bring beam 32 in contact with contact structure 28. In such an embodiment, the voltages may be applied simultaneously or in series. In addition, as with the application of a single voltage, the voltage level of each actuation is preferably small enough such that beam 32 does not contact either of gate electrodes 24 and 26. In an embodiment in which the gate electrodes are actuated simultaneously, the application of the voltages may counteract each other, preventing beam 32 from coming in contact with gate electrodes 24 and 26. Consequently, larger voltages may be applied in such an embodiment than as compared to an embodiment in which the gate electrodes are actuated in series. Moreover, the voltage levels applied to gate electrodes 24 and 26 may be approximately the same or may be different. Applying different amounts of voltage may be advantageous in some embodiments, particularly in embodiments in which the device components are arranged asymmetrically under beam 32. For example, in an embodiment in which contact structure 28 is arranged closer to gate electrode 24 than gate electrode 26, the voltage applied to gate electrode 24 may be smaller than the voltage applied to gate electrode 26 so that beam 32 may not come in contact with gate electrode 24.

In an alternative embodiment, beam 32 may be brought into contact with contact structure 28 upon an actuation of either gate electrode 24 or 26. FIG. 4b illustrates an embodiment in which gate electrode 24 is actuated to bring beam 32 in contact with contact structure 28 as shown by the curvature of beam 32 over gate electrode 24. Such an illustration includes a concave curvature of beam 32 over gate electrode 26, indicating the lack of actuation of gate electrode 26. Alternatively, the portion of beam 32 over gate electrode 26, in such an embodiment, may include a convex curvature. In either embodiment, such a curvature may be due to residual stresses within beam 32. On the contrary, in an embodiment in which little or no residual stresses are contained within beam 32, the portion of beam 32 over gate electrode 26 may have a substantially straight profile. In yet a different embodiment, gate electrode 26 may be actuated to bring beam 32 in contact with contact structure 28 (not shown). As stated above, the application of voltage to actuate either of gate electrodes 24 or 26 is preferably small enough such that beam 32 does not contact gate electrodes 24 and 26.

FIGS. 5–9 illustrate another exemplary embodiment of a microelectromechanical device including a contact structure interposed between a pair of electrodes arranged underneath a beam. In particular, FIGS. 5–9 illustrate MEMS device 40 arranged upon substrate 22. MEMS device 40 may include contact structures 41, 42, and 43 interposed between gate electrodes 44 and 46 and under beam 52. In some embodiments (not shown), MEMS device 40 may include additional contact structures interposed between gate electrodes 44 and 46 and/or contact structures 41, 42, and 43. In another embodiment, MEMS device 40 may include insulating structures (not shown) arranged between gate electrodes 44 and 46 and contact structures 41, 42, and 43. The perspective and top views of MEMS device 40 may be substantially similar to the perspective and top views of MEMS device 20 of FIGS. 1 and 2, respectively, with exception to the differences in size, shape, location, and number of the device components as discussed below.

Beam 52 may be substantially similar to beam 32 of FIGS. 1–4b. As such, beam 52 may include a similar composition as beam 32. For example, beam 52 may include a contiguous layer of conductive material such that MEMS device 40 may be adapted to pass a signal from a first end of beam 52 to a second end of beam 52 without bringing beam 52 in contact with any one of contact structures 41, 42, and 43. In addition, MEMS device 40 may be adapted to pass a signal between one and/or both ends of beam 52 and one or more of contact structures 41, 42, and 43. In this manner, MEMS device 20 may be adapted to pass a signal from beam 52 to contact structures 41, 42, and/or 43 or vice versa. Moreover, beam 52, in such an embodiment, may bridge a connection between two drain regions of a circuit such that a signal may pass through them. In addition, such a signal may be, for example, an electrical, acoustical, thermal, or optical signal.

Alternatively, beam 52 may include insulating element 57 interposed between conductive portions 56 and 58 of beam 52. Such an insulating element may be arranged over contact structures 42 and in some embodiments, centered over contact structure 42 as shown in FIGS. 5–9. Alternatively, insulating element 57 may be arranged along any lateral portion of beam 52, including above and centered over contact structures 41 and/or 43. In general, insulating element 57 may be arranged along any lateral portion of beam 52, including above and between the gate electrodes and contact structures. In some cases, beam 52 may include multiple insulating elements. In addition or alternatively, the width of insulating element 57, in some embodiments, may be smaller than the width of the contact structure 42. As such, the conductive portions of beam 52 on either side of insulating element 57 may be in contact with contact structure 42 when beam 52 is brought in contact with contact structure 42. Consequently, MEMS device 40 may be adapted to pass a signal between one end of beam 52 and contact structures 42. In addition, MEMS device 40 may be adapted to pass a signal from a first end of beam 52 to a second end of beam 52 through contact structure 42. Moreover, beam 52, in such an embodiment, may bridge a connection between two drain regions of a circuit such that a signal may pass through them. In some cases, insulating element 57 may be axially arranged within beam 52. More specifically, insulating element 57 may be interposed between conductive portions of beam 52 which extend from one end of beam 52 to the other end of beam 52.

In some embodiments, beam 52 may include one or more recessed portions as shown in FIGS. 5–9. Such recessed portions are preferably arranged over at least one of contact structures 41, 42, and 43. In addition or alternatively, contact structures 41, 42, and 43 may include raised sections arranged upon their respective upper surfaces. The raised sections (not shown) may be, for example, flat, pointed, square, or rounded sections with a smaller area than that of the underlying base portion of the respective contact structure. The raised sections of the contact structures and/or the recessed portions of the beam, in combination or independently, may help localize the contact and prevent contact between beam 52 and contact structures 41, 42, and 43. In addition, the raised and recessed features may help break through any contamination that may reside within the contact interface between beam 52 and contact structures 41, 42, and 43. In an alternative embodiment, beam 52 may not include recessed portions and contact structures 41, 42, and 43 may not include raised sections.

In addition, beam 52 may be supported by single support structure 54 as shown in FIGS. 5–9. In such an embodiment, beam 52 may serve as a cantilever in which the distal end of beam 52 is unsupported. Alternatively, beam 52 may be supported by two support structures at the respective ends of beam 52. Support structure 54 may be substantially similar to that of support structures 34 of MEMS device 20 of FIGS. 1–4b. As such, support structure 54 may include similar composition and dimensions of support structures 34. Alternatively, support structure 54 may be substantially larger than support structures 34. For example, support structure 54 may extend from substrate 22 to the underside of beam 52 as shown in FIGS. 5–9. Larger or smaller support structures, however, may be used depending on the design specifications of the device. In some embodiments, support structure 54 may be an electrical terminal with which to transmit signals to and from beam 52. Alternatively, support structure 54 may be constructed from an insulating material.

Gate electrodes 44 and 46 may be substantially similar to gate electrodes 24 and 26 of MEMS device 20 of FIGS. 1–3. As such, gate electrodes 44 and 46 may be spaced below beam 52 and arranged upon substrate 22. In addition, gate electrodes 44 and 46 may include substantially the same composition and dimensions as gate electrodes 24 and 26. Alternatively, the widths of gate electrodes 44 and 46 may be substantially different. In either embodiment, the lengths of gate electrodes 44 and 46 may extend perpendicular to the width of beam 52. In some cases, gate electrodes 44 and 46 may extend beyond the periphery of beam 52. Alternatively, gate electrodes 44 and 46 may reside entirely under the periphery of beam 52. In one embodiment, gate electrodes 44 and 46 may be arranged symmetrically under beam 52. More specifically, gate electrodes 44 and 46 may be arranged under beam 52 such that there is an equal distance from the side of each gate electrode opposite to that of adjacent contact structures 41 and 43 to their respective ends of the beam. Such a symmetrical arrangement may also include an equal distance between each of the gate electrodes and adjacent contact structures 41 and 43. Conversely, the arrangement of gate electrodes 44 and 46, in some embodiments, may be asymmetrical under beam 52. In this manner, gate electrodes 44 and 46 may be spaced at an unequal distance from the respective ends of beam 52 and contact structures 41 and 43.

Contact structures 41, 42, and 43 may be substantially similar to contact structure 28 of MEMS device 20 of FIGS. 1–3. In particular, contact structures 41, 42, and 43 may include the same materials as those used for contact structure 28. Similar to contact structure 28 of FIG. 1, contact structures 41, 42, and 43 are preferably interposed between gate electrodes 44 and 46. In addition, contact structures 41, 42, and 43 may extend perpendicular to the width of beam 52. In some embodiments, contact structures 41, 42, and 43 may extend beyond the periphery of beam 52. In other embodiments, contact structures 41, 42, and 43 may reside entirely under the periphery of beam 52. In addition, as shown in FIGS. 5–9, the widths of contact structures 41, 42, and 43 may be substantially the same as each other. Alternatively, contact structures 41, 42, and 43 may have substantially different widths.

Moreover, contact structures 41, 42, and 43 may be arranged symmetrically under beam 52. For example, contact structures 41, 42, and 43 may be arranged under beam 52 such that there is an equal distance between the gate electrodes and the adjacent contact structure. Conversely, the arrangement of contact structures 41, 42, and 43, in some embodiments, may be asymmetrical under beam 52. In this manner, contact structures 41, 42, and 43 may be spaced at an unequal distance from each other and gate electrodes 44 and 46. Furthermore, contact structures 41, 42, and/or 43 may include multiple sections. In contrast, contact structures 41, 42, and/or 43 may be single structures. In addition or alternatively, MEMS device 40 may be adapted to pass a signal from beam 52 to one or more of contact structures 41, 42, and 43 or vice versa. Moreover, beam 52 may bridge a connection between two drain regions of a circuit such that a signal may pass through them. In such an embodiment, one or more of contact structures 41, 42, and 43 may serve as conductive pads such that a signal transmitted through beam 52 may be conducted through one or more of contact structures 41, 42, and 43 when beam 52 is in contact with one or more of the respective contact structures.

In the embodiment of FIGS. 5–9, the upper surface of contact structure 42 is above the upper surfaces of contact structures 41 and 43 and gate electrodes 44 and 46. Larger and smaller heights of each of the contact structures, however, may be appropriate depending on the design specifications of the device. For example, either or both of the upper surfaces of contact structures 41 and 43 may be above or below contact structure 42. In some cases, each contact structure may be substantially the same height. In particular, each of contact structures 41, 42, and 43 may be the substantially the same height as gate electrodes 44 and 46. Alternatively, each of the contact structures may be smaller or larger than gate electrodes 44 and 46. A device with upper surfaces of one or more of the contact structures above gate electrodes 44 and 46 may be advantageous to prevent contact of beam 52 with gate electrodes 44 and 46.

Figure 6:
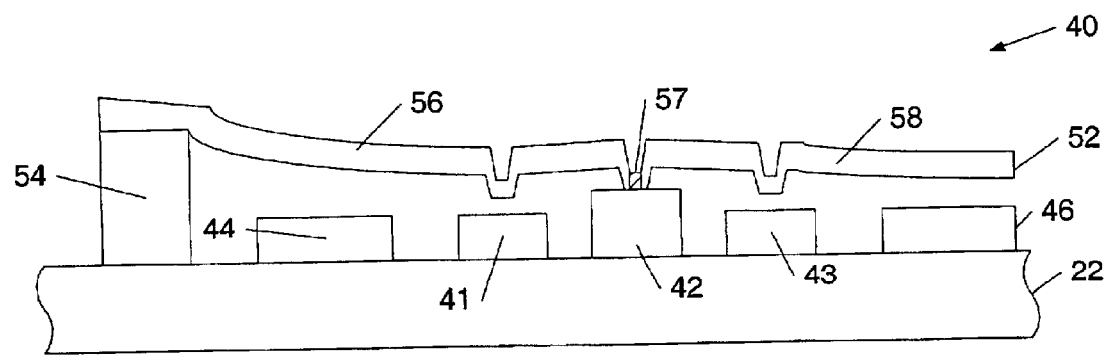
FIG. 6 depicts a partial cross-sectional view of the microelectromechanical device of FIG. 5 with the beam in contact with one of the contact structures.

As illustrated in FIG. 6, beam 52 may be brought in contact with contact structure 42. Such a connection may be made in the same manner as MEMS device 20. More specifically, one or more closing voltages may be applied to either or both of gate electrodes 44 and 46 such that beam 52 electrostatically closes contact structure 42. Alternatively, the residual stresses contained within beam 52 may bring the beam in contact with contact structure 42. In some cases, MEMS device 40 may be configured such that beam 52 may be brought in contact with either or both of contact structures 41 and/or 43, rather than contact structure 42 (configuration not shown). For example, the upper surfaces of either or both of contact structures 41 and/or 43 may be above the upper surface of contact structure 42 such that beam 52 may contact structures 41 and/or 43 before contact structure 42. The higher upper surfaces may include, in some embodiments, raised sections on contact structures 41 and/or 43. In addition or alternatively, beam 52 may include larger recessed portions above contact structures 41 and/or 43 than above contact structure 42. In addition or alternatively, beam 52 may not include any recessed portions above contact structure 42.

Figure 7:
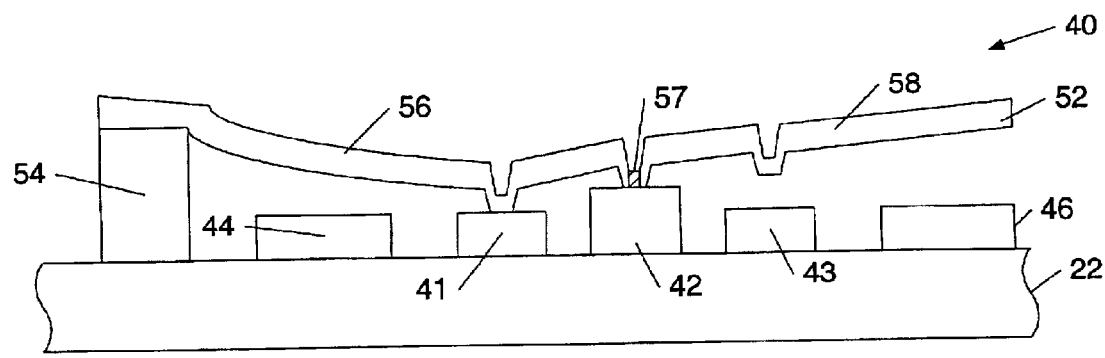
FIG. 7 depicts a partial cross-sectional view of the microelectromechanical device of FIG. 6 with the beam in contact with two of the contact structures.
Figure 8:
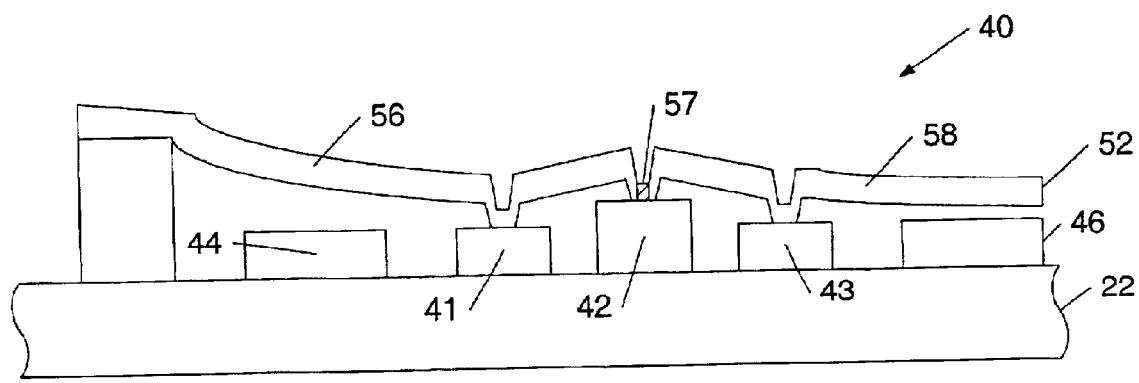
FIG. 8 depicts a partial cross-sectional view of the microelectromechanical device of FIG. 6 with the beam in contact with all of the contact structures.
Figure 9:
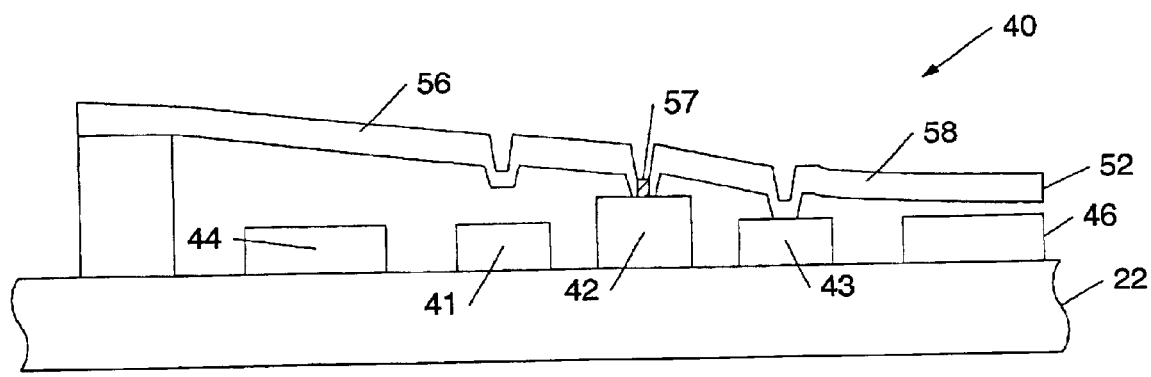
FIG. 9 depicts a partial cross-sectional view of the microelectromechanical device of FIG. 6, with the beam in contact with a different two of the contact structures.

In an alternative embodiment, the residual stresses and/or the application of the closing voltages may further bring beam 52 in contact with contact structures 41 and/or 43 as shown in FIGS. 7–9. In particular, FIG. 7 may illustrate the actuation of gate electrode 44 such that beam 52 is brought in contact with contact structures 41 and 42. Gate electrode 46 may be alternatively activated to bring beam 52 in contact with contact structures 42 and 43 as shown in FIG. 9. FIG. 8 may illustrate an embodiment in which closing voltages are applied to both gate electrodes 44 and 46 such that beam 52 is in contact with all of contact structures 41, 42, and 43. Such applications of voltages may be simultaneous or in series. For example, gate electrode 44 may be actuated as shown in FIG. 7 to bring beam 52 in contact with contact structures 41 and 42. Subsequently, gate electrode 46 may be actuated to bring beam 52 in contact with contact structure 43 as shown in FIG. 8.

Alternatively, the voltages may be applied to gate electrodes 44 and 46 simultaneously such that beam 52 may be brought in contact with contact structures 41, 42, and 43. In yet another embodiment, the closing voltages applied to gate electrodes 44 and 46 as shown in FIG. 6 may be increased such that beam 52 is further brought in contact with contact structures 41 and 43. Moreover, the release of one of the closing voltages applied to gate electrodes 44 and 46 may bring beam 52 in contact with contact structures 41 or 43. For example, in an embodiment in which closing voltages are applied to gate electrodes 44 and 46 to bring beam 52 in contact with contact structure 42 as shown in FIG. 6, the closing voltage applied to gate electrode 46 may be released such that beam 52 subsequently contacts contact structure 41 as shown in FIG. 7. Similarly, the closing voltage applied to gate electrode 44 in FIG. 6 may be released such that beam 52 subsequently contacts contact structure 42 as shown in FIG. 9.

In an embodiment in which an electrostatic force is applied to one of the gate electrodes (e.g., gate electrode 44) to bring beam 52 in contact with one or more of the contact structures (e.g., contact structure 41), beam 52 may be pulled away from contact structure 41 in a variety of manners. For example, the closing voltage may simply be disconnected from gate electrode 44 to deflect beam 52 from contact structure 41. However, in many cases, the release of such a voltage may not be enough to deflect beam 52 from contact structure 41 due to stiction problems discussed earlier, particularly when using low voltage levels. An alternative method of pulling beam 52 away from contact structure 41 is to actuate gate electrode 46 to pull beam 52 away from contact structure 41. In some embodiments, such an actuation voltage may not bring beam 52 in contact with contact structure 43. Alternatively, such an actuation may bring beam 52 in contact with contact structure 43 as shown in FIG. 9. Similarly, actuation of gate electrode 44 may bring beam 52 in contact with structure 41 in an embodiment in which gate electrode 46 is initially actuated to bring beam 52 in contact with contact structure 43. In this manner, the device may serve as a functional switch since contact can be made and released at contact structures 41 and 43 by actuating either one or both gate electrodes 44 and 46.

In either embodiment, one of the contact structures may serve as a focal contact structure in order to deflect beam 52 away from another contact structure. For example, contact structure 42 may serve as a focal contact structure, which beam 52 may use to deflect away from contact structure 41. In such an embodiment, the combination of contact structure 42 and the recessed portion of beam 52 above contact structure 42 may act as a fulcrum for deflecting beam 52 from contact structure 41. In addition or alternatively, contact structure 42 may include a raised section. Such configurations may insure that the distal end of beam 52 is sufficiently spaced from contact structure 41 upon deflection.

In some cases, the deflection of beam 52 from contact structure 41 may require the closing voltage applied to gate electrode 44 to be released. In such an embodiment, the required actuation voltage upon gate electrode 46 may be less than the actuation voltage required in an embodiment in which the actuation voltage alone causes beam 52 to pull away from contact structure 41. Consequently, the actuation and closing voltages may be optimized such that a minimal amount of voltage may be used to activate each gate electrode. The release of the closing voltage may occur at various times relative to the application of the actuation voltage. For example, the release of the closing voltage may be conducted simultaneously with the application of the actuation voltage such that the deflection of beam 52 is substantially immediate. Alternatively, the release of the closing voltage may occur in series with the application of the actuation voltage, and thus the release of closing voltage may be delayed after the application of the actuation voltage. In such an embodiment, beam 52 may be in contact with all of contact structures 41, 42, and 43 at the same time as shown in FIG. 8.

In another embodiment, the application of the actuation voltage may occur after the release of the closing voltage. In yet another embodiment, the deflection of beam 52 from contact structure 41 may require an increase of the actuation voltage applied to gate electrode 46 after the release of the closing voltage from gate electrode 44. In such an embodiment, the required actuation voltage may be smaller than the actuation voltage required in an embodiment in which the actuation voltage alone causes beam 52 to pull away from contact structure 41. In addition, the required actuation voltage in such an embodiment may be smaller than the actuation voltage required in an embodiment in which the closing voltage is released subsequent to the application of the actuation voltage.

FIGS. 10–14 illustrate another exemplary embodiment of a microelectromechanical device including a contact structure interposed between a pair of electrodes arranged underneath a beam. In particular, FIGS. 10–14 illustrate MEMS device 60 arranged upon substrate 22. MEMS device 60 may include contact structures 68 interposed between gate electrode 64 and 66 and under beam 72. In some embodiments (not shown), MEMS device 60 may include additional contact structures interposed between gate electrodes 64 and 66 and/or contact structures 68. In another embodiment, MEMS device 60 may include insulating structures (not shown) arranged between gate electrodes 64 and 66 and contact structures 68. The perspective and top views of MEMS device 60 may be substantially similar to the perspective and top views of MEMS device 20 of FIGS. 1 and 2, respectively with exception to the differences in size, shape, location, and number of the device components as discussed below.

Gate electrodes 64 and 66 may be substantially similar to gate electrodes 24 and 26 of MEMS device 20 of FIGS. 1–3. As such, gate electrodes 64 and 66 may be spaced below beam 72 and arranged upon substrate 22. In addition, gate electrodes 64 and 66 may include substantially the same composition and dimensions as gate electrodes 24 and 26. Alternatively, the widths of gate electrodes 64 and 66 may be substantially different as shown in FIGS. 10–14. In either embodiment, the lengths of gate electrodes 64 and 66 may extend perpendicular to the width of beam 72. In some cases, gate electrodes 64 and 66 may extend beyond the periphery of beam 72. Alternatively, gate electrodes 64 and 66 may reside entirely under the periphery of beam 72. In one embodiment, gate electrodes 64 and 66 may be arranged symmetrically under beam 72. In an alternative embodiment gate electrodes 64 and 66 may be arranged asymmetrically under beam 72. More specifically, gate electrodes 64 and 66 may be arranged under beam 72 such that there is an unequal distance from the sides of the gate electrodes opposite to that of contact structures 68 to the respective ends of the beam as shown in FIGS. 10–14. Such an asymmetrical arrangement may also include an unequal distance between each of the gate electrodes and adjacent contact structures 68.

Contact structures 68 may be substantially similar to contact structures 41, 42, and 43 of MEMS device 40 of FIGS. 5–9. In particular, contact structures 68 may include the same materials as those used for contact structures 41, 42, and 43. In addition, contact structures 68 are preferably interposed between gate electrodes 64 and 66. Moreover, one or more of contact structures 68 may extend perpendicular to the width of beam 72. In some embodiments, one or more of contact structures 68 may extend beyond the periphery of beam 72. In other embodiments, one or more of contact structures 68 may reside entirely under the periphery of beam 72. Moreover, contact structures 68 may be arranged symmetrically under beam 72. For example, contact structures 68 may be arranged under beam 72 such that there is an equal distance between the gate electrodes and the adjacent contact structure. Conversely, the arrangement of contact structures 68, in some embodiments, may be asymmetrical under beam 72. In this manner, contact structures 68 may be spaced at an unequal distance from each other and gate electrodes 64 and 66. Furthermore, one or more of contact structures 68 may include multiple sections. In contrast, one or more of contact structures 68 may be single structures. In an embodiment, one or more of contact structures 68 may serve as conductive pads. In such an embodiment, a signal transmitted through beam 72 may be conducted through one or more of contact structure 68 when beam 72 is in contact with the respective contact structures.

As shown in FIGS. 10–14, contact structures 68 may be different sizes. Alternatively, contact structures 68 may be approximately the same size. In particular, larger and smaller heights and widths of each of the contact structures may be appropriate depending on the design specifications of the device. For example, the upper surfaces of one or more of contact structures 68 may be above or below the upper surfaces of adjacent contact structures. Likewise, one or more of contact structures 68 may be wider or narrower than adjacent contact structures. Furthermore, the upper surfaces of one or more of contact structures 68 may be above or below gate electrodes 64 and 66 and/or wider or narrower than gate electrodes 64 and 66. A device with upper surfaces of one or more of the contact structures above the gate electrodes may be advantageous to prevent contact of beam 72 with gate electrodes 64 and 66.

In some cases, one or more of contact structures 68 may include raised sections arranged upon the upper portions of the respective structures as shown in FIGS. 10–14. The raised sections may be, for example, flat, pointed, square, or rounded sections with a smaller area than that of the underlying base portion of the respective contact structure. In addition or alternatively, beam 72 may include recessed portions above one or more of contact structures 68 to prevent contact with the gate electrodes. The raised sections of the contact structures and/or the recessed portions of the beam, in combination or independently, may help localize the contact and prevent contact between the gate electrodes and the beam. In addition, the raised and recessed features may help break through any contamination that may reside within the contact interface between the contact structures and beam. In an alternative embodiment, contact structures 68 may not include raised sections. In addition, beam 72 may not include any recessed portions as shown in FIGS. 10–14.

Beam 72 may be substantially similar to beam 32 of FIGS. 1–4b. As such, beam 72 may include the same composition as beam 32. In addition, beam 72 may be supported by support structures 74 at the respective ends of beam 72 as shown in FIGS. 10–14. Alternatively, beam 72 may be supported by a single support structure such that beam 72 is a cantilever beam. Support structures 74 may be substantially similar to that of support structures 34 of MEMS device 20 of FIGS. 1–4b. As such, support structures 74 may include similar compositions and dimensions of support structures 34. Alternatively, support structure 74 may be substantially larger than support structures 34 as shown in FIGS. 10–14. Larger or smaller support structures, however, may be used depending on the design specifications of the device. In some embodiments, support structures 74 may be electrical terminals with which to transmit signals to and from beam 72. Alternatively, support structures 74 may be constructed from an insulating material.

Figure 14:
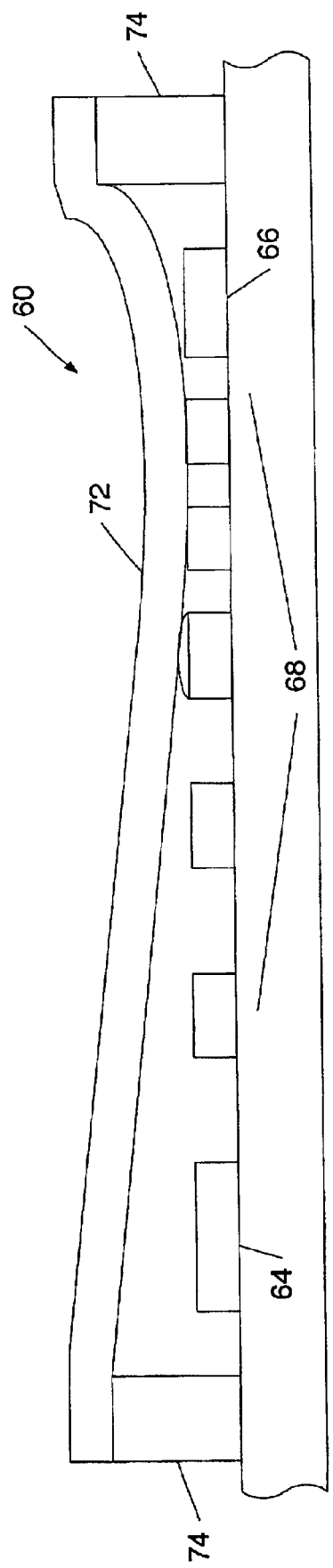
FIG. 14 depicts a partial cross-sectional view of the microelectromechanical device of FIG. 6 with the beam in contact with a different plurality of the contact structures.

As illustrated in FIGS. 11–14, beam 72 may be brought in contact with one or more of contact structures 68. Such connections may be made in a similar manner as discussed above for MEMS device 40. More specifically, one or more closing voltages may be applied to either or both of gate electrodes 64 and 66 such that beam 72 electrostatically closes one or more of contact structures 68. Alternatively, the residual stresses contained within beam 72 may bring the beam in contact with one or more of contact structures 68. In some cases, MEMS device 60 may be configured such that beam 72 is in contact with one of contact structures 68. For example, beam 72 may be brought in contact with the contact structure adjacent to gate electrode 64 as shown in FIG. 11. In some cases, the residual stresses and/or the application voltage on gate electrodes 64 and/or 66 may further bring beam 72 in contact with additional contact structures. For example, beam 72 may be brought in contact with the contact structure adjacent to gate electrode 64, the contact structure with the raised section, and the contact structure interposed between such contact structures as shown in FIG. 12. Alternatively, MEMS device 60 may be configured such that beam 72 contacts only the contact structure adjacent to gate electrode 64 and the contact structure with the raised section. In such an embodiment, the upper surface of the contact structure with the raised section may be high enough such that beam 72 is brought into contact with the raised section before other contact structures. Similar embodiments may occur actuating gate electrode 66 to contact the one or more contact structures adjacent to gate electrode 66 as shown in FIG. 14.

As stated above, gate electrodes 64 and 66 may both be actuated to bring beam 72 in contact with one or more contact structures. In some cases, such an actuation may bring beam 72 in contact with all of contact structures 68 as shown in FIG. 13. Moreover, the release of one of the closing voltages applied to gate electrodes 64 and 66 may deflect beam 72 from one or more of contact structures 68. For example, the voltage applied to gate electrode 64 may be released to deflect beam 72 from one or more of the contact structures adjacent to gate electrode 64 as shown in FIG. 14. In such an embodiment, beam 72 may stay in contact with one or more of the contact structures adjacent to gate electrode 66. In many cases, however, the release of such a voltage may not be enough to deflect beam 72 from the contact structure adjacent gate electrode 64 due to stiction problems discussed earlier, particularly when using low voltage levels.

An alternative method of pulling beam 72 away from a contact structure is to actuate either of gate electrodes 64 or 66 to pull beam 72 away from a contact structure located near the non-actuated gate electrode. In some embodiments, such an actuation may bring beam 72 in contact with one or more contact structures arranged adjacent to the actuated gate electrode. In this manner, the device may serve as a functional switch since contact can be made and released at one or more contact structures by actuating either one or both gate electrodes 64 and 66. Alternatively, such an actuation voltage may not bring beam 72 in contact with contact structures adjacent to the actuated gate electrode. In either embodiment, one of the contact structures may serve as a focal contact structure in order to deflect beam 72 away from another contact structure. For example, the contact structure with the raised surface may serve as a focal contact structure from which beam 72 may use to deflect away from one or more contact structures.

In some cases, the deflection of beam 72 from contact structure 41 may require the closing voltage applied to either gate electrode 64 or 66 to be released while the actuation voltage is applied to the other gate electrode. In such an embodiment, the required actuation voltage may be less than the actuation voltage required in an embodiment in which the actuation voltage alone causes beam 72 to pull away from the contact structures. Consequently, the actuation and closing voltages may be optimized such that a minimal amount of voltage may be used to activate each gate electrode. The release of the closing voltage may occur at various times relative to the application of the actuation voltage. For example, the release of the closing voltage may be conducted simultaneously with the application of the actuation voltage such that the deflection of beam 72 is substantially immediate.

Alternatively, the release of the closing voltage may occur in series with the application of the actuation voltage, and thus the release of closing voltage may be delayed after the application of the actuation voltage. In such an embodiment, beam 72 may be in contact with all of contact structures 68 at the same time as shown in FIG. 13. In another embodiment, the application of the actuation voltage may occur after the release of the closing voltage. In another embodiment, the release of the voltage applied to gate electrode 64 may not be enough to deflect beam 72 from the contact structures adjacent to gate electrode 64 due to stiction problems discussed earlier, particularly when using low voltage levels. An alternative method of pulling beam 72 away from one or more of contact structures 68 may require an increase of the actuation voltage applied to gate electrode 66 after the release of the closing voltage from gate electrode 64.

Figure 15:
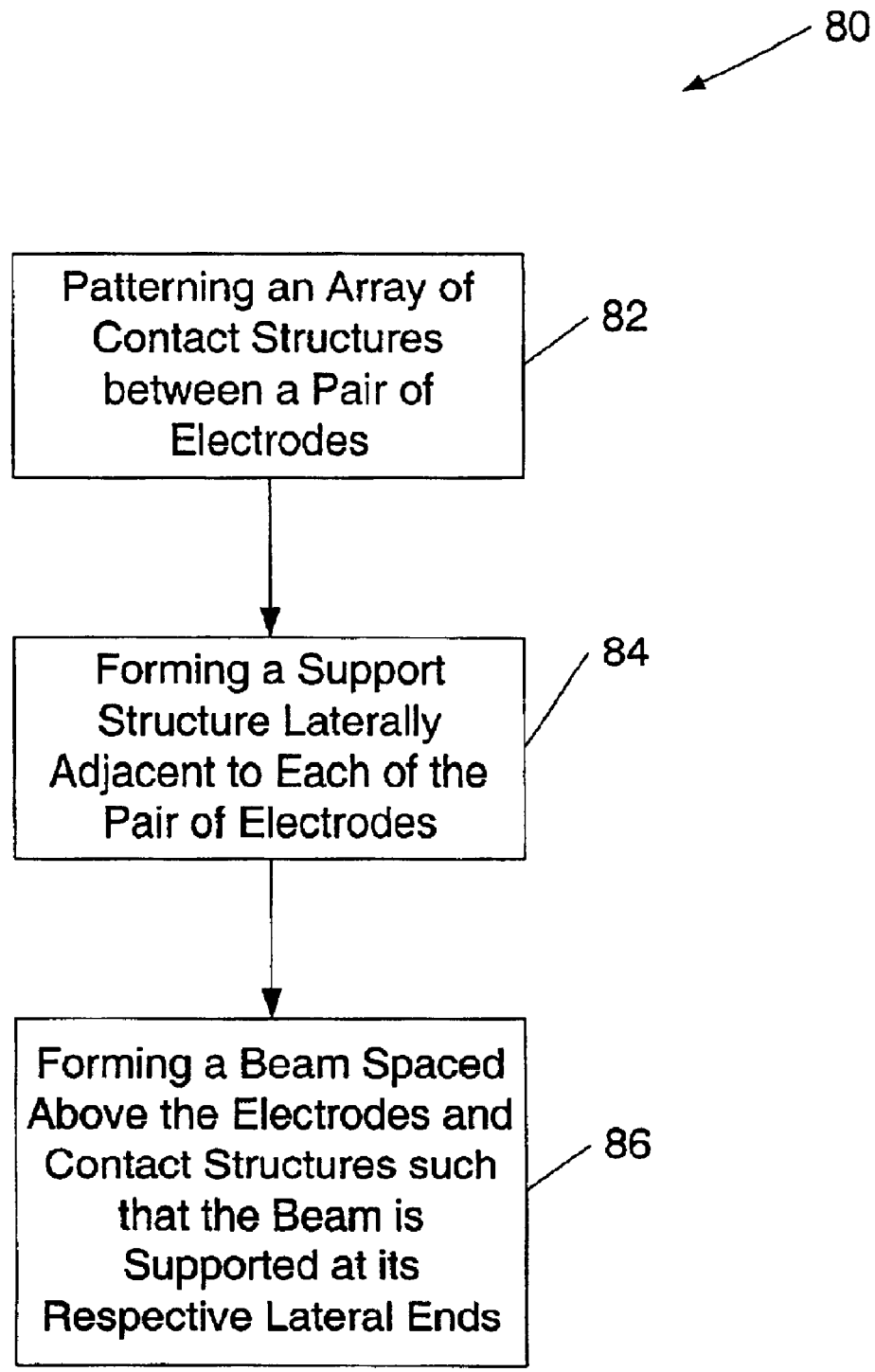
FIG. 15 depicts a flow chart of a method for forming the microelectromechanical devices of FIGS. 1, 5, and 10.

An exemplary embodiment of a method for forming the structures of FIGS. 1–14 is depicted in the flowchart of FIG. 15. In particular, method 80 includes step 82, which includes patterning an array of contact structures between a pair of electrodes. The formation of the contact structures may include patterning a conductive material and/or a dielectric layer disposed upon a semiconductor substrate. However, other methods commonly used for the fabrication of microelectromechanical devices may also be used. In an embodiment in which the contact structures include raised sections, the respective structures may be formed by patterning a base portion of the structure and patterning the raised section upon the upper portion of the base portion. Step 84 may follow with forming a support structure laterally adjacent to each of the pair of electrodes. In particular, the support structures may be formed adjacent to the side of the gate electrodes opposite from the side facing the array of contact structures. In an alternative embodiment, step 84 may precede step 82 as long as the array of contact structures is arranged between the pair of electrodes. Alternatively, the pair of electrodes, the contact structures, and/or support structures may be formed simultaneously if they include the same materials. In yet another embodiment, the support structure may be formed along with the cantilever as discussed below.

The next step, step 86, may follow by forming a beam spaced above the pair of electrodes and the array of contact structures such that the beam is supported at its respective lateral ends. More specifically, forming the beam may include forming a sacrificial layer upon the pair of electrodes, contact structures, and exposed portions of the substrate. Moreover, forming the beam may include depositing a beam layer upon the sacrificial layer, patterning the beam layer, and subsequently removing the sacrificial layer. Removing such a sacrificial layer may include etch techniques commonly used in the fabrication of microelectromechanical devices such as wet or dry etch processes. The sacrificial layer may include any material with substantially different etch characteristics than the beam layer. In an embodiment in which the beam is formed to include recessed portions, forming the sacrificial layer may include conformally depositing the sacrificial layer upon the upper surface of the topography. Such a formation may further include etching portions of the sacrificial layer where the recessed portions will be formed. Alternatively, the sacrificial layer may be formed by patterning a first sacrificial layer followed by patterning a second sacrificial layer upon the first sacrificial layer with recessed regions incorporated into the patterned layers. After formation of the beam layer, the sacrificial layer may be removed, thereby suspending the beam above the pair of electrodes and the array of contact structures for motion in response to the appropriate applied force.

The steps described above may not include all steps used in forming the microelectromechanical device, and certainly do not include all steps used in forming a typical circuit containing such a device. The above-described steps may be combined with other steps used for, e.g., transistor fabrication in forming a complete circuit. Further steps may include those relating to, e.g., interconnection, passivation, and packaging of a circuit.

It will be appreciated to those skilled in the art having the benefit of this disclosure that this invention is believed to provide a microelectromechanical device with a contact structure interposed between a pair of electrodes. Further modifications and alternative embodiments of various aspects of the invention will be apparent to those skilled in the art in view of this description. For example, different configurations of switches may be incorporated with the aspects of the device described herein. In particular, the beam may have various shapes such as extensions or gaps within its structure. It is intended that the following claims be interpreted to embrace all such modifications and changes and, accordingly, the drawings and the specification are to be regarded in an illustrative rather than a restrictive sense.

What is claimed is:

1. A microelectromechanical device, comprising:
    a beam suspended by support structures affixed to first and second ends of the beam, wherein the device is adapted to pass a signal from the first end to the second end;
    a pair of electrodes arranged beneath the beam; and
    multiple contact structures interposed between said pair of electrodes, wherein a distance between a first contact structure and the beam is larger than a distance between a second contact structure the beam when substantially no power is applied to the device.

2. The device of claim 1, adapted to pass the signal without bringing the beam in contact with the contact structures.

3. The device of claim 2, wherein said beam comprises a contiguous layer of conductive material.

4. The device of claim 1, adapted to pass the signal upon bringing the beam in contact with at least one of the contact structures.

5. The device of claim 4, wherein said beam comprises an insulating element interposed between the first and second ends of the beam.

6. The device of claim 1, wherein said device is further adapted to pass the signal from either the first end or second end of the beam to at least one of the contact structures.

7. The device of claim 1, wherein said device is further adapted to pass the signal from both the first end and second end of the beam to at least one of the contact structures.

8. The device of claim 1, wherein an upper surface of the first contact structure is above upper surfaces of the second contact structures.

9. The device of claim 1, wherein an upper surface of the first contact structure is approximately level with upper surfaces of the second contact structures.

10. The device of claim 1, wherein said beam comprises a recessed portion above the first contact structure.

11. The device of claim 1, wherein said first contact structure comprises a raised section arranged upon its upper surface.

12. The device of claim 1, wherein at least one of the contact structures comprises multiple sections spaced apart from each other and along a width of the beam.

13. A microelectromechanical device, comprising:
    a beam suspended by support structures affixed to respective ends of the beam, wherein the beam comprises an insulating element interposed between the respective ends of the beam;
    a pair of electrodes arranged beneath the beam; and
    a contact structure interposed between said pair of electrodes wherein the device is adapted to pass a signal between one end of the beam and the contact structure.

14. The device of claim 13, wherein said device is further adapted to pass the signal between both respective ends of the beam and the contact structure.

15. The device of claim 13, wherein said device is further adapted to pass the signal between the respective ends of the beam.

16. The device of claim 13, further comprising one or more additional contact structures interposed between said pair of electrodes.

17. The device of claim 13, wherein the insulating element is arranged above the contact structure.

18. The device of claim 13, wherein a width of the insulating element is smaller than a width of the contact structure.

19. A microelectromechanical device comprising at least three contact structures interposed between a pair of electrodes, wherein the contact structures and pair of electrodes are laterally spaced along and under a length of a beam.

20. The device of claim 19, further comprising a support structure attached to a first end of the beam.

21. The device of claim 20, further comprising an additional support structure attached to a second end of the beam.

22. The device of claim 19, adapted to bring the beam in contact with one or more of the contact structures.

23. The device of claim 22, wherein said beam comprises residual forces adapted to bring the beam into contact with one or more of the contact structures.

24. The device of claim 23, wherein said residual forces are further adapted to curl the beam away from one or more of the contact structures distinct from the one or more contact structures in contact with the beam.

25. The device of claim 22, adapted to bring the beam into contact with one or more of the contact structures upon an application of one or more closing voltages to at least one of the pair of electrodes.

26. The device of claim 22, adapted to bring the beam into contact with one or more of the contact structures upon an application of a magnetic force.

27. The device of claim 19, adapted to pull the beam away from one or more of the contact structures in contact with the beam.

28. The device of claim 27, adapted to pull the beam away from the one or more contact structures upon an application of an actuation voltage to one of the pair of electrodes.

29. The device of claim 28, wherein the application of the actuation voltage is adapted to bring the beam in contact with one or more contact structures not previously in contact with the beam.

30. The device of claim 27, adapted to pull the beam away from one or more contact structures upon:
   an application of an actuation voltage to one of the pair of electrodes, and
   a release of a closing voltage applied to the other of the pair of electrodes used to bring the beam in contact with the one or more contact structures.

31. The device of claim 27, adapted to pull the beam away from one or more contact structures upon:
   an application of an actuation voltage to one of the pair of electrodes;
   a release of a closing voltage applied to the other of the pair of electrodes used to bring the beam in contact with the one or more contact structures; and
   a subsequent increase of the actuation voltage.

32. The device of claim 19, wherein the at least three contact structures comprise:
   a first contact structure interposed between the pair of electrodes;
   a second contact structure interposed between the first contact structure and one of said pair of electrodes; and
   a third contact structure interposed between the first contact structure and the other of the pair of electrodes.

33. The device of claim 32, further comprising one or more contact structures interposed between said first and second contact structures.

34. The device of claim 32, further comprising one or more contact structures interposed between said second contact structure and the one of said pair of electrodes.

35. The device of claim 32, wherein said first contact structure is arranged under the center point of the beam.

36. The device of claim 32, wherein said first contact structure is arranged closer to the one of said pair of electrodes than to the other of said pair of electrodes.

* * * * *

UNITED STATES PATENT AND TRADEMARK OFFICE
CERTIFICATE OF CORRECTION

PATENT NO. : 6,787,438 B1
DATED : September 7, 2004
INVENTOR(S) : Nelson

It is certified that error appears in the above-identified patent and that said Letters Patent is hereby corrected as shown below:

Title page,
Item [73], Assignee, please delete "Teravieta" and substitute therefor -- Teravicta --.

Column 20,
Line 26, please delete "structure the beam" and substitute therefor -- structure and the beam --.

Signed and Sealed this

First Day of February, 2005

JON W. DUDAS
*Director of the United States Patent and Trademark Office*